US012648391B2

(12) United States Patent
Kim

(10) Patent No.: US 12,648,391 B2
(45) Date of Patent: Jun. 2, 2026

(54) APPARATUS FOR CLEANING PROCESS AND METHOD FOR CLEANING PROCESS

(71) Applicant: Samsung Electronics Co., Ltd., Suwon-si (KR)

(72) Inventor: Chaelyoung Kim, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 140 days.

(21) Appl. No.: 18/490,241

(22) Filed: Oct. 19, 2023

(65) Prior Publication Data

US 2024/0194499 A1 Jun. 13, 2024

(30) Foreign Application Priority Data

Dec. 8, 2022 (KR) ........................ 10-2022-0170478

(51) Int. Cl.
*H10P 72/00* (2026.01)
*H10P 70/00* (2026.01)

(52) U.S. Cl.
CPC .......... *H10P 72/0414* (2026.01); *H10P 70/23* (2026.01); *H10P 72/0408* (2026.01); *H10P 72/0436* (2026.01)

(58) Field of Classification Search
CPC ......... H01L 21/67051; H01L 21/67115; H01L 21/67034; H01L 21/67028; H01L 21/6715
See application file for complete search history.

(56) References Cited

U.S. PATENT DOCUMENTS

| | | | |
|---|---|---|---|
| 8,105,997 | B2 | 1/2012 | Zhu et al. |
| 8,227,394 | B2 | 7/2012 | Zhu et al. |
| 8,314,055 | B2 | 11/2012 | Mui et al. |
| 8,916,338 | B2 | 12/2014 | Quillen et al. |
| 8,944,077 | B2 | 2/2015 | Kato et al. |
| 9,799,538 | B2 | 10/2017 | Kaneko et al. |
| 9,991,141 | B2 | 6/2018 | Muramoto |
| 11,107,672 | B2 | 8/2021 | Lee |
| 11,342,203 | B2 | 5/2022 | Jeong et al. |
| 11,823,914 | B2 | 11/2023 | Park et al. |
| 2002/0035762 | A1* | 3/2002 | Okuda .............. H01L 21/67046 134/102.1 |
| 2003/0215751 | A1* | 11/2003 | Otake ............... H01L 21/67115 430/311 |

(Continued)

FOREIGN PATENT DOCUMENTS

| | | | |
|---|---|---|---|
| CN | 112201591 A | | 1/2021 |
| JP | H0992634 A | * | 4/1997 |
| TW | I584367 B | | 5/2017 |

OTHER PUBLICATIONS

Machine translation: JPH0992634; Kizaki, K. (Year: 1997).*
Taiwanese Office Action and Search Report dated Oct. 8, 2024 issued in Taiwanese Patent Application No. 112141856.

*Primary Examiner* — Natasha N Campbell

(74) *Attorney, Agent, or Firm* — Harness, Dickey & Pierce, P.L.C.

(57) ABSTRACT

In a method for cleaning process, a substrate on which a layer is formed may be loaded on a substrate stage. A photocurable resin may be spin coated on the layer to form a photocurable resin layer. Light may be irradiated onto the photocurable resin layer for curing the photocurable resin layer to form a polymer layer containing particles adsorbed from a surface of the layer. The polymer layer containing the particles may be removed.

10 Claims, 8 Drawing Sheets

(56) References Cited

U.S. PATENT DOCUMENTS

| | | | |
|---|---|---|---|
| 2004/0211756 A1* | 10/2004 | Kume | H01L 21/31111 |
| | | | 257/E21.251 |
| 2011/0146705 A1* | 6/2011 | Hart | H01L 21/02041 |
| | | | 134/2 |
| 2020/0075326 A1* | 3/2020 | Hatazaki | H01L 21/0228 |
| 2020/0094298 A1* | 3/2020 | Chang | H01L 21/67115 |
| 2021/0020462 A1 | 1/2021 | Jeong et al. | |

* cited by examiner

APPARATUS FOR CLEANING PROCESS AND METHOD FOR CLEANING PROCESS

CROSS-REFERENCE TO RELATED APPLICATION(S)

This application claims priority under 35 USC § 119 to Korean Patent Application No. 10-2022-0170478, filed on Dec. 8, 2022, in the Korean Intellectual Property Office (KIPO), the contents of which are incorporated by reference herein in their entirety.

BACKGROUND

1. Field

Example embodiments of the present disclosure relate to apparatuses for a cleaning process and/or methods for a cleaning process. More particularly, apparatuses and/or methods for cleaning of particles remaining on a surface of a substrate or a layer, in manufacturing of a semiconductor device.

2. Description of the Related Art

In manufacturing of a semiconductor device, particles remaining on a surface of a substrate or a layer may cause defects in the semiconductor device. Therefore, the particles may be removed by a cleaning process. However, it is not easy to completely remove fine particles without damaging the surface of the substrate or the layer.

SUMMARY

Some example embodiments provide methods for a cleaning process for removing particles on a surface of a substrate or a layer.

Some example embodiments provide apparatuses for cleaning process for removing particles on a surface of a substrate or a layer.

According to an example embodiment, a method for the cleaning process may include loading a substrate on which a layer is formed on a substrate stage, spin-coating a photocurable resin on the layer to form a photocurable resin layer, irradiating light onto the photocurable resin layer for curing the photocurable resin layer to form a polymer layer containing particles adsorbed from a surface of the layer, and removing the polymer layer containing the particles.

According to an example embodiment, an apparatus for the cleaning process may include a chamber, a substrate stage at a lower portion of an inside of the chamber, and the substrate stage configured to horizontally rotate, a nozzle structure over the substrate stage in the chamber, and a light source structure configured to face the substrate stage in the chamber. The light source structure may include a lamp unit configured to irradiate light and a protective structure configured to protect the lamp unit and coupled to the lamp unit.

According to an example embodiment, an apparatus for a cleaning process may include a chamber, a substrate stage at a lower portion of inside of the chamber, and the substrate stage configured to horizontally rotate, a nozzle structure over the substrate stage in the chamber, and the nozzle structure including a nozzle and a driver configured to drive and move the nozzle, and a lamp over the nozzle structure in the chamber. A light emission surface of the lamp may be configured to completely overlap a portion of the nozzle structure depending on a position of the nozzle structure.

In the method for the cleaning process according to some example embodiments, the photocurable resin layer may be cured to form the polymer layer containing particles adsorbed from the surface of the layer, and the polymer layer containing the particles may be removed. Therefore, the particles may be effectively removed without damage of the surface of the layer. In the apparatus for the cleaning process according to some example embodiments, the lamp may not be contaminated by chemicals or the like during the cleaning process. Therefore, defects due to the contamination of the lamp may be decreased in the cleaning process.

BRIEF DESCRIPTION OF THE DRAWINGS

Example embodiments will be more clearly understood from the following detailed description taken in conjunction with the accompanying drawings.

FIG. 1 is a flow chart for explaining a method for a cleaning process according to an example embodiment;

FIGS. 2 to 7 are cross-sectional views for explaining the method for a cleaning process:

FIGS. 8 and 9 are cross-sectional views illustrating an apparatus for the cleaning process according to an example embodiment:

FIG. 10 is a plan view of a lamp unit of a light source structure in the apparatus for the cleaning process according to an example embodiment:

FIG. 11 is a plan view of a protective structure of a light source structure in the apparatus for the cleaning process according to an example embodiment:

FIGS. 12 and 13 are plan views illustrating a light source structure in the apparatus for the cleaning process according to an example embodiment; and FIGS. 14 and 15 are cross-sectional views illustrating an apparatus for the cleaning process according to an example embodiment.

DETAILED DESCRIPTION

Hereinafter, some example embodiments of the present inventive concepts will be described in detail with reference to the accompanying drawings.

Figure 1:
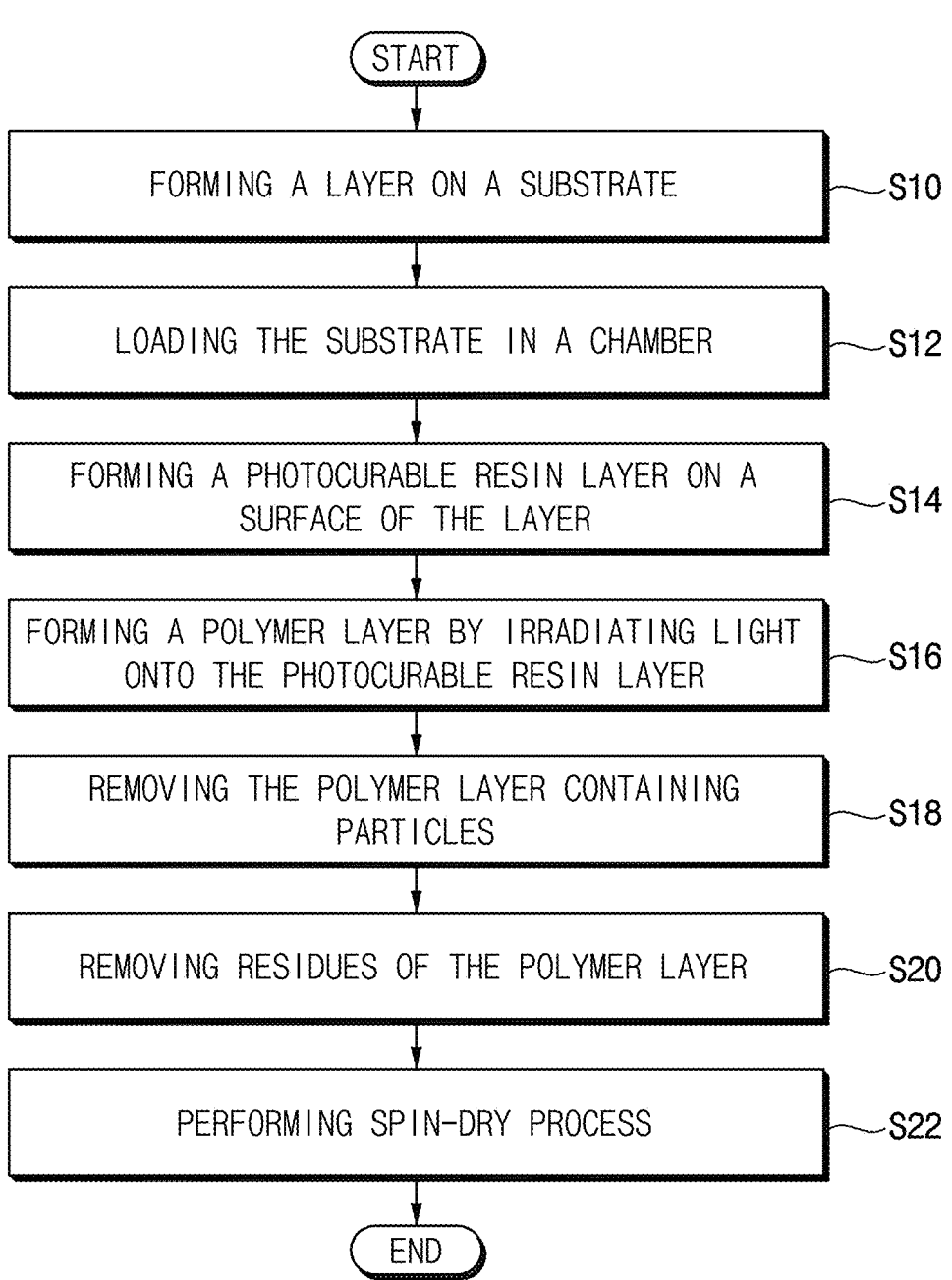
FIGS. 1 to 15 represent non-limiting, example embodiments as described herein.

FIG. 1 is a flow chart for explaining a method for a cleaning process according to an example embodiment, and FIGS. 2 to 7 are cross-sectional views for explaining the method for a cleaning process.

Figure 2:
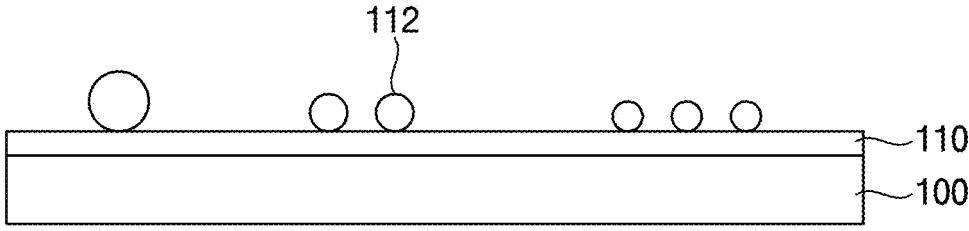

Referring to FIGS. 1 and 2, a layer 110 may be formed on a substrate 100 (S10).

The substrate 100 may include a semiconductor material such as silicon, germanium, silicon-germanium, or a group III-V compound such as GaP, GaAs, or GaSb. In some example embodiments, the substrate 100 may be a Silicon On Insulator (SOI) substrate or a Germanium On Insulator (GOI) substrate.

The layer 110 may include one of layers used in manufacturing a semiconductor device, and a material of the layer may not be limited. In some example embodiments, the layer 110 may include an insulation layer or a conductive layer. The insulation layer may include, for example, silicon oxide, silicon oxynitride, silicon nitride, or an amorphous carbon layer. The conductive layer may include, for example, polysilicon, metal silicide, metal, or metal nitride. In some example embodiments, the layer 110 may have a patterned shape.

Particles 112 (e.g., contamination or residue) generated in processes for forming the layer 110 may remain or may be adsorbed on a surface of the layer 110. In the cleaning process, the particles on the surface of the layer 110 may be cleaning targets (e.g., materials to be cleaned).

In some example embodiments, a surface of the substrate 100 may be the cleaning target, and in this case, a process for forming the layer on the substrate 100 may not be performed before the cleaning process (e.g., before cleaning the surface of the substrate 100).

Figure 3:
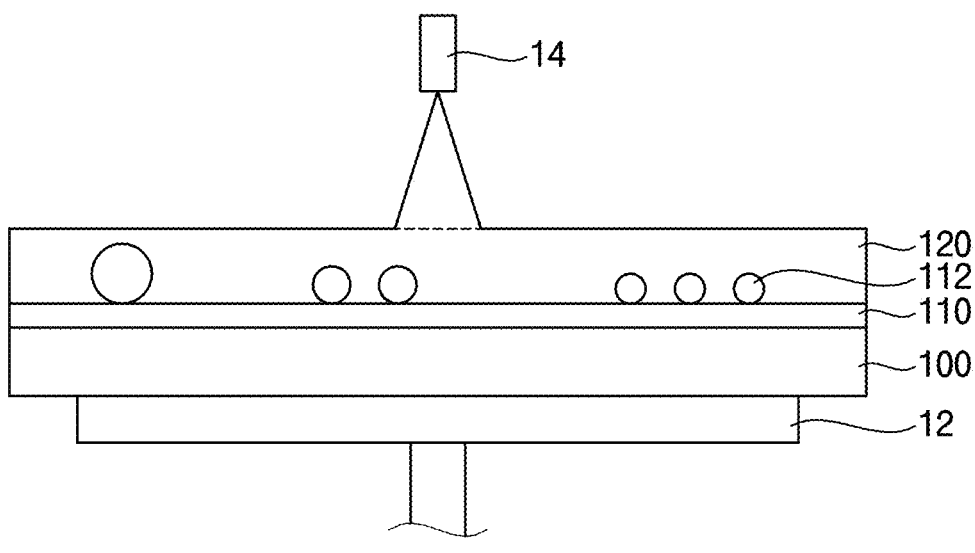

Referring to FIGS. 1 and 3, the substrate 100 may be loaded on a substrate stage 12 in a chamber (S12). The substrate stage 12 may rotate horizontally.

Thereafter, a photocurable resin may be coated on the surface of the layer 110 by a spin coating process to form a photocurable resin layer 120. (S14).

In some example embodiments, while the substrate 100 on which the layer 110 is formed may be horizontally rotated, the photocurable resin may be supplied on an upper surface of the layer 110 through a nozzle 14 to form the photocurable resin layer 120.

The photocurable resin may include a monomer, an oligomer and a photoinitiator. The photocurable resin may be a synthetic resin of a liquid state. The photoinitiator may be an ultraviolet curable initiator or laser curable initiator, and a type of the photoinitiator not be limited. For example, the photoinitiator may include 1-hydroxycyclohexylphenyl ketone, benzyl dimethyl ketal, hydroxydimethylacetophenone, benzoin, benzoin methyl ether, benzoin ethyl ether, benzoin isopropyl ether, benzoin butyl ether, or the like.

The photocurable resin may include, for example, an ultraviolet (UV) curable resin or a laser curable resin.

In some example embodiments, the photocurable resin may not include solvent. In some example embodiments, the photocurable resin may include one or more solvents. The solvent may be organic solvent, and a type of the solvent may not be limited.

Figure 4:
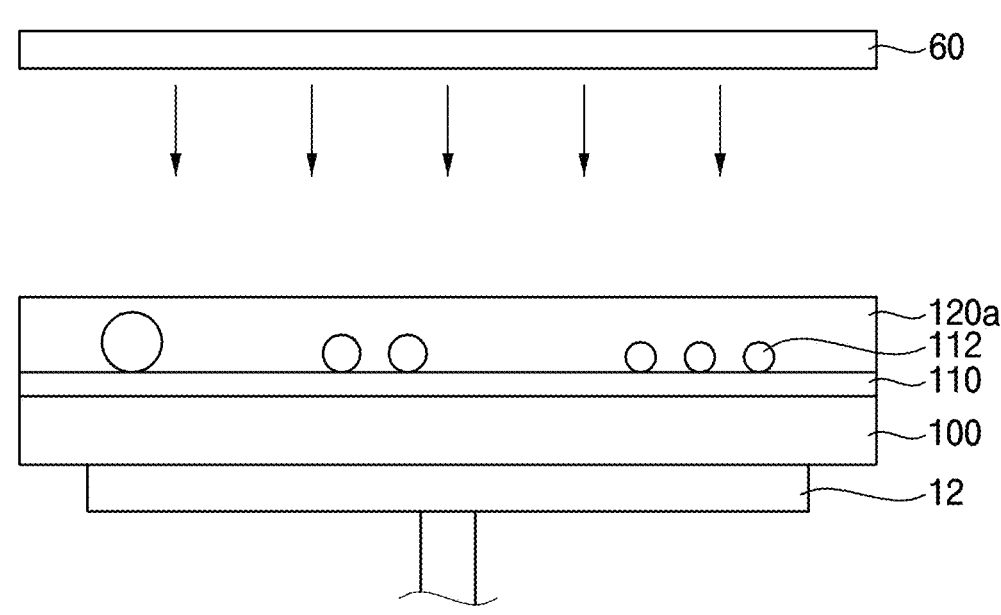

Referring to FIGS. 1 and 4, light may be irradiated onto the photocurable resin layer 120, so that the photocurable resin layer 120 may be cured to form a polymer layer 120a. (S16). When the light is irradiated onto the photoinitiator included in the photocurable resin layer 120, a photopolymerization reaction may be initiated, and thus the monomer and the oligomer included in the photocurable resin layer 120 may be converted into a polymer.

The light may include a UV light, a laser, or the like.

When the process for forming the photocurable resin layer 120 and the process for irradiating light onto the photocurable resin layer 120 are performed, the particles 112 on the surface of the layer 110 may be adsorbed or trapped into the polymer layer 120a. The polymer layer 120a may include particles 112 adsorbed from the surface of the layer 110, and thus the particles 112 may be detached from the surface of the layer 110.

The polymer layer 120a formed by irradiating the light onto the photocurable resin layer 120 may have high bonding strength with the particles 112. In addition, the photocurable resin layer 120 may be uniformly cured, and thus the polymer layer 120a may be uniformly formed on the layer 110. That is, the polymer layer 120a may have uniform thickness, regardless of positions of an upper surface of the substrate 100. Therefore, polymer residues on the layer 110 may be decreased, after a subsequent cleaning process for removing the polymer layer 120a.

In some example embodiments, when a solvent is not included in the photocurable resin, the solvent may not need to be volatilized in the processes for forming the polymer layer 120a. Thus, the photocurable resin layer 120 may be rapidly cured to form the polymer layer 120a. A process time for forming the polymer layer 120a may be decreased.

In some example embodiments, when the photocurable resin includes a solvent, the solvent may be volatilized by the light and the photocurable resin may be cured to form the polymer layer 120a.

A light source (e.g., a lamp) for irradiating the light may not be exposed to the outside except when performing the process of irradiating the light. In some example embodiments, the light source may not be exposed in performing a spin coating process, a subsequent rinsing process, and a subsequent spin-drying process, etc. Therefore, when the processes are performed, a contamination of the light source may be blocked or prevented.

Figure 5:
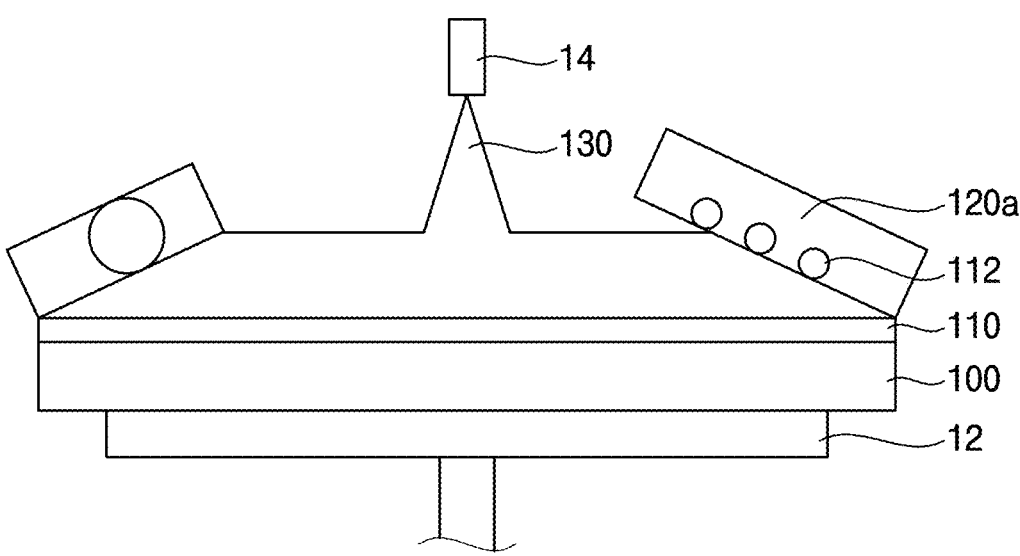

Referring to FIGS. 1 and 5, the polymer layer 120a containing the particles 112 may be removed. (S18) The removing process may include a first rinsing process. The first rinsing process may be performed by horizontally rotating the substrate 100 while introducing the first rinsing solution 130.

When the first rinsing process is performed, the surface of the layer 110 may be exposed. As the polymer layer 120a containing the particles is removed, most of the particles on the surface of the layer 110 may be removed. Also, when the particles 112 are removed, the surface of the layer 110 may not be damaged.

Figure 6:
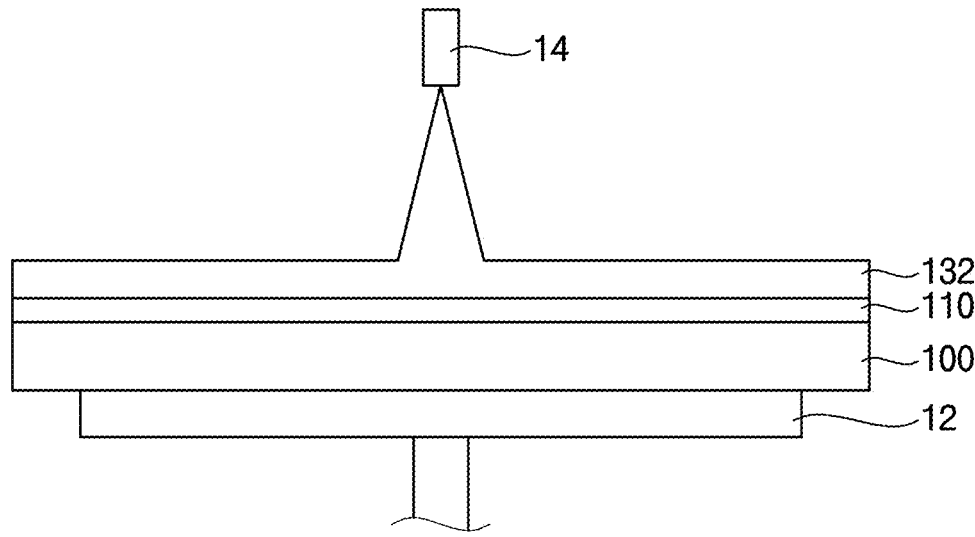

Referring to FIGS. 1 and 6, residues of the polymer layer 120a may be removed (S20). The removing process may include a second rinsing process. The second rinsing process may be performed by horizontally rotating the substrate 100 while introducing the second rinsing solution 132. The second rinsing solution 132 and the first rinsing solution 130 may be different from each other. In some example embodiments, the second rinsing process may not be performed.

By the above process, the polymer layer 120a containing the particles 112 may be completely removed.

Figure 7:
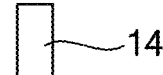
Figure 7:
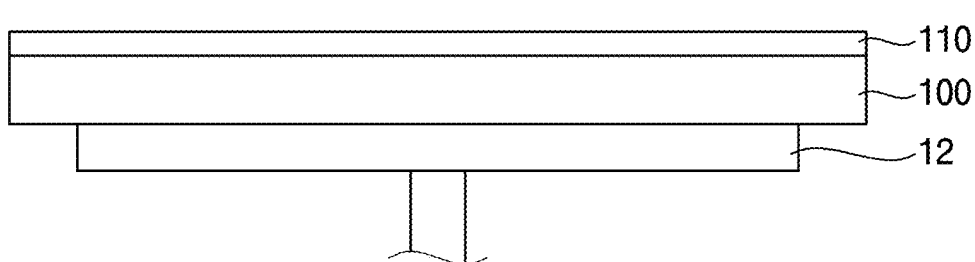

Referring to FIGS. 1 and 7, the substrate 100 may be spin-dried to remove the second rinsing solution 132 remaining on the layer 110. (S22). In some example embodiments, the substrate 100 may be spin-dried to remove the first rinsing solution 130 remaining on the layer 110 after the polymer layer 120a containing the particles 112 using the first rinse solution at S18.

As described above, the photocurable resin layer may be formed on the layer or the substrate to be cleaned. The light for curing may be irradiated onto the photocurable resin layer to form the polymer layer containing particles therein. Thereafter, the polymer layer may be removed, so that particles on the layer or the substrate may be effectively removed without defects of the layer or the substrate.

Hereinafter, an example embodiment of an apparatus for the cleaning process may be described.

Figure 8:
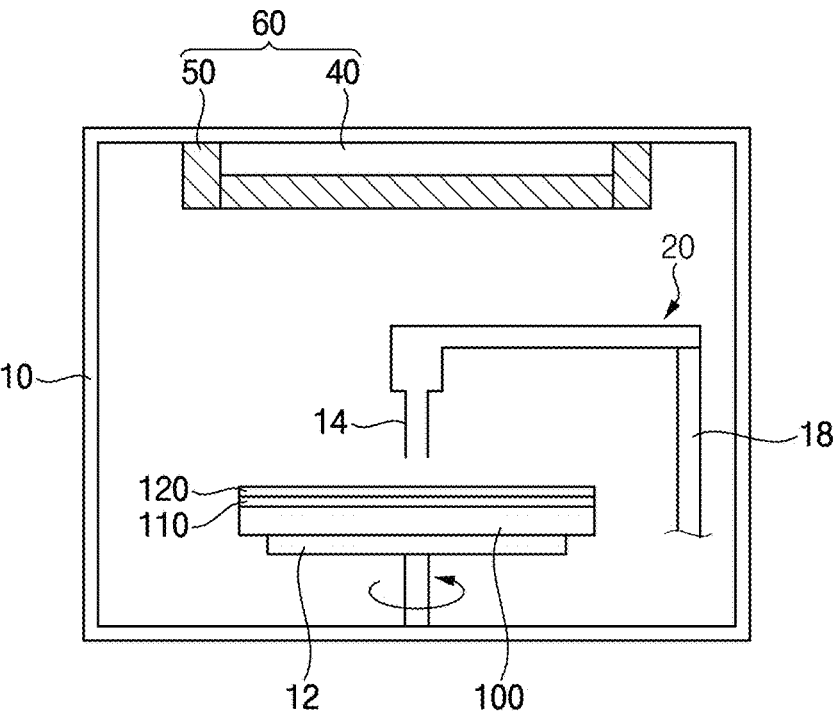
Figure 9:
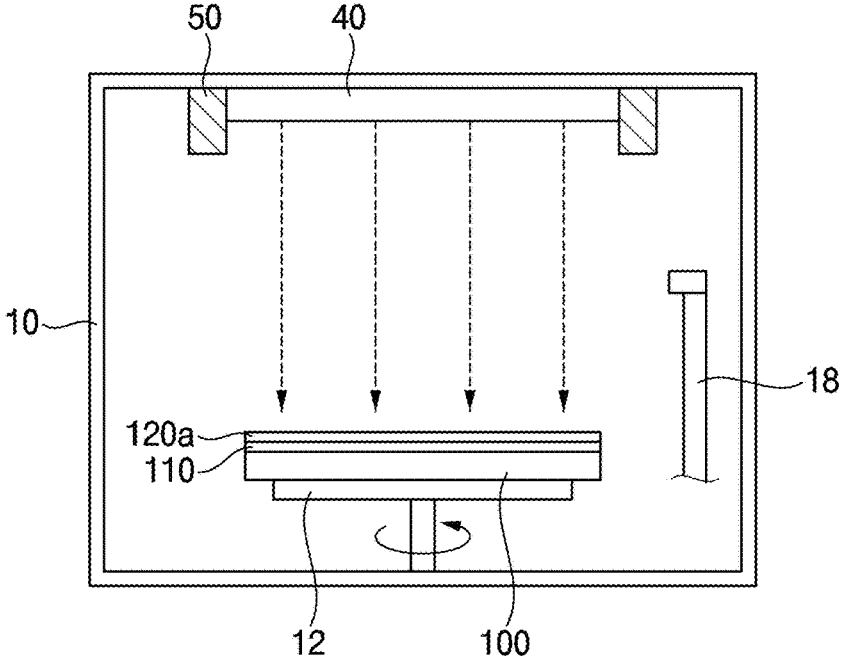
Figure 10:
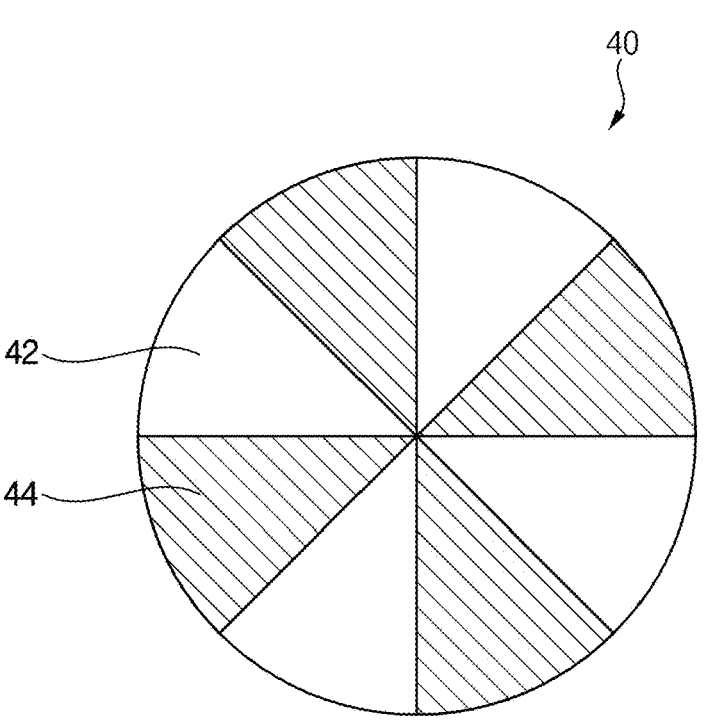
Figure 11:
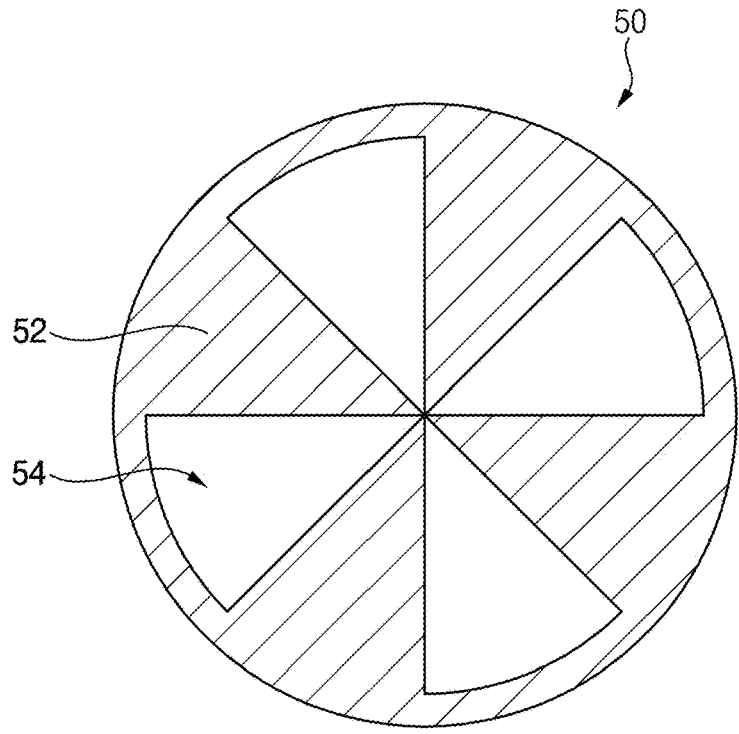
Figure 12:
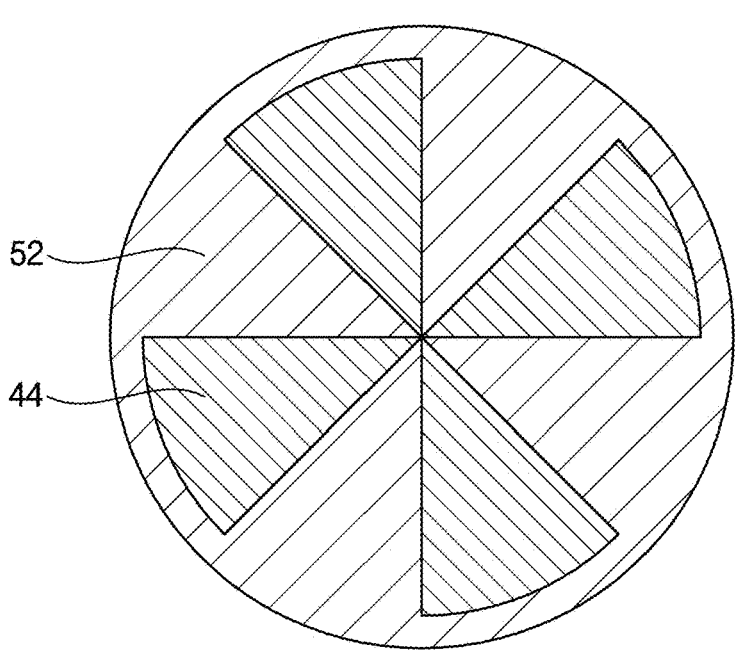
Figure 13:
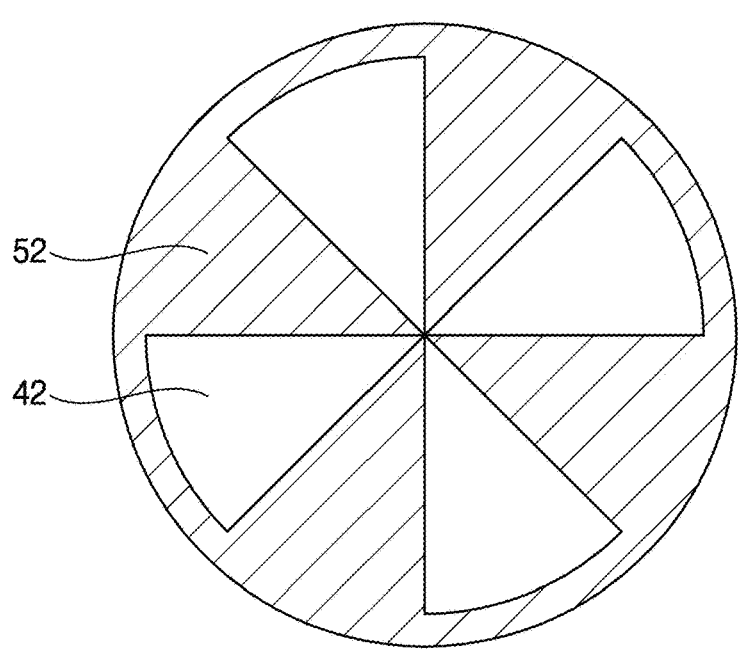

FIGS. 8 and 9 are cross-sectional views illustrating an apparatus for the cleaning process according to some example embodiments. FIG. 10 is a plan view of a lamp unit of a light source structure in the apparatus for the cleaning process according to an example embodiment. FIG. 11 is a plan view of a protective structure of a light source structure in the apparatus for the cleaning process according to an example embodiment. FIGS. 12 and 13 are plan views illustrating a light source structure in the apparatus for the cleaning process according to an example embodiment.

FIG. 8 is the apparatus for the cleaning process when chemicals (e.g., cleaning solution) are supplied in the apparatus. FIG. 9 is the apparatus for the cleaning process when a lamp is used. FIG. 12 is a light source structure when lamp is not used in the apparatus for the cleaning process. FIG. 13 is a light source structure when a lamp is used in the apparatus for the cleaning process. The light source structure shown in each of FIGS. 8 and 9 is a cross-sectional view of a central portion of the light source structure.

Referring to FIGS. 8 and 9, the apparatus for the cleaning process may include a chamber 10, a substrate stage 12, a nozzle structure 20 and a light source structure 60 formed in the chamber 10. Further, the apparatus for the cleaning process may further include controllers (not shown) for controlling operations of the substrate stage 12, the nozzle structure 20, and the light source structure 60, respectively.

The substrate 100 may be loaded on the substrate stage 12, and the substrate stage 12 may support the substrate 100. The layer 110 to be cleaned may be formed on the substrate 100. In some example embodiments, when the surface of the substrate 100 is a cleaning target, the layer may not be formed on the substrate 100. Hereinafter, it may be described that the layer 110 is formed on the upper surface of the substrate 100, and particles on a surface of the layer 110 is the cleaning target.

The nozzle structure 20 may be disposed over the substrate stage 12. The nozzle structure 20 may be spaced apart from an upper surface of the substrate stage 12. The nozzle structure 20 may supply chemicals onto the layer 110.

The light source structure 60 may be spaced apart from an upper portion of the nozzle structure 20. Light may be irradiated onto the layer 110 from the light source structure 60. The light source structure 60 may be disposed at an upper portion of an inside of the chamber 10. For example, the light source structure 60 may be disposed above the nozzle structure 20.

In some example embodiments, the substrate stage 12 may include a driving unit (or alternatively, a driver such as a motor, not shown) for horizontal rotation. Thus, the substrate 100 loaded on the substrate stage 12 may be horizontally rotated. The substrate stage 12 may be disposed at a lower portion of the inside of the chamber 10.

Chemicals (e.g., photocurable resin or rinse solution) may be supplied onto the layer 110 through the nozzle structure 20. The nozzle structure 20 may include at least one nozzle 14 facing the upper surface of the layer 110. The nozzle structure 20 may be disposed above the upper surface of the layer 110

In an example embodiments, the nozzle structure 20 may include a chemical supply unit (not shown) for supplying the photocurable resin, a nozzle 14 for discharging the photocurable resin from the chemical supply unit onto the upper surface of the layer 110, and a driving unit (or alternatively, a driver such as a motor) 18 for driving and moving the nozzle 14. In some example embodiments, a plurality of nozzles for supplying rinse solution or other chemicals may be further included in the chamber 10.

In the cleaning process, when the light is irradiated from the light source structure 60, the nozzle 14 may move so as not to face each of a lamp in the light source structure 60 and the substrate 100. The photocurable resin may include an ultraviolet curable resin or a laser curable resin.

In a state where the substrate 100 loaded on the substrate stage 12 may horizontally rotate, the photocurable resin may be supplied on the layer 110 through the nozzle 14. Accordingly, a photocurable resin layer 120 may be formed on the layer 110.

The light source structure 60 may be disposed to face the upper surface of the substrate 100. The light source structure 60 may be disposed to face substrate stage 12, and the light source structure 60 may be disposed at the upper portion of the inside of the chamber 10.

The light source structure 60 may form a polymer layer 120a by irradiating the light onto the photocurable resin layer 120.

The light source structure 60 may include a lamp unit 40 and a protective structure 50. The lamp unit 40 and the protective structure 50 may be coupled to each other. In some example embodiments, the lamp unit 40 may include a UV lamp radiating ultraviolet light or a laser lamp radiating laser.

A lamp unit 40 may be mounted inside the protective structure 50. The protective structure 50 may protect the lamp unit 40 when the lamp is not used. The protective structure 50 may surround at least a light emission surface of the lamp unit 40.

Referring to FIG. 10, the lamp unit 40 may have a plate shape. For example, the lamp unit 40 may have a disk shape having a size similar to or greater than a size of the substrate 100. The lamp unit 40 may include an emission region 42 including a lamp and a non-emission region 44 including no lamp. The lamp unit 40 may irradiate the light from only the emission region 42. The lamp unit 40 may include a plurality of emission regions 42 and a plurality of non-emission region 44. The emission region 42 and the non-emission region 44 may be alternately and repeatedly arranged. The plurality of emission regions 42 may have the same shapes and the same size to each other. The plurality of non-emission regions 44 may have the same shapes and the same size to each other.

In some example embodiments, when the lamp unit 40 has the disk shape, each of the emission regions 42 and the non-emission regions 44 may have a fan shape. For example, the emission regions 42 and the non-emission regions 44 may have the same shape and the same size.

Referring to FIG. 11, a portion of the protective structure 50 facing the substrate stage 12 may have a plate shape.

A plate-shaped portion of the protective structure 50 may have a light blocking portion 52 and an open portion 54. When the light blocking portion 52 of the protective structure 50 overlap the emission region 42 of the lamp unit, the light blocking portion 52 of the protective structure 50 may completely cover at least the emission region 42 of the lamp unit 40. In addition, when the open portion 54 of the protective structure 50 overlap the emission region 42 of the lamp unit, at least a portion of the emission region 42 may be exposed.

In some example embodiments, when the lamp unit 40 has a disk shape, the light blocking portion 52 and the open portion 54 may be alternately and repeatedly arranged so as to correspond to the emission region 42 and the non-emission region 44. The light blocking portion 52 and the open portion 54 of the protective structure 50 may overlap the emission region 42 and the non-emission region 44 of the lamp unit 40. For example, the open portion 54 may have a fan shape having an area equal to or less than an area of the emission region 42 of the lamp unit 40 so as to expose at least a portion of the emission region 42 of the lamp unit 40. Also, an area other than the open portion 54 may serve as the light blocking portion 52.

In a state where the lamp unit 40 is mounted inside the protective structure 50, the protective structure 50 or the lamp unit 40 may be horizontally rotated.

Referring to FIG. 12, when the lamp is not used in the cleaning process, the protective structure 50 or the lamp unit 40 may be horizontally rotated so that the emission region 42 of the lamp unit 40 and the light blocking portion 52 of the protective structure 50 may overlap each other. When the lamp is not used in the cleaning process, the emission region 42 may be completely covered by the light blocking portion
52 so that the emission region 42 may not be exposed. When
the lamp is not used in the cleaning process, the lamp (e.g.,
the emission region 42) may not be contaminated by chemi-
cals used in the cleaning process. Accordingly, when the
cleaning process is performed, defects due to contamination
of the lamp may be decreased.

Referring to FIG. 13, when a lamp is used in the cleaning
process, the protective structure 50 or the lamp unit 40 may
be horizontally rotated so that the emission region 42 of the
lamp unit 40 and the open portion 54 of the protective
structure 50 may overlap each other. When the lamp is used
in the cleaning process, the emission region 42 may be
exposed by the open portion 54. Accordingly, the light may
be irradiated onto the photocurable resin layer 120 through
the emission region 42 of the lamp unit 40. In some example
embodiments, when the lamp is used in the cleaning process,
the substrate stage 12 may be horizontally rotated or hori-
zontally moved. Accordingly, the light may be uniformly
irradiated onto the photocurable resin layer 120.

Figure 14:
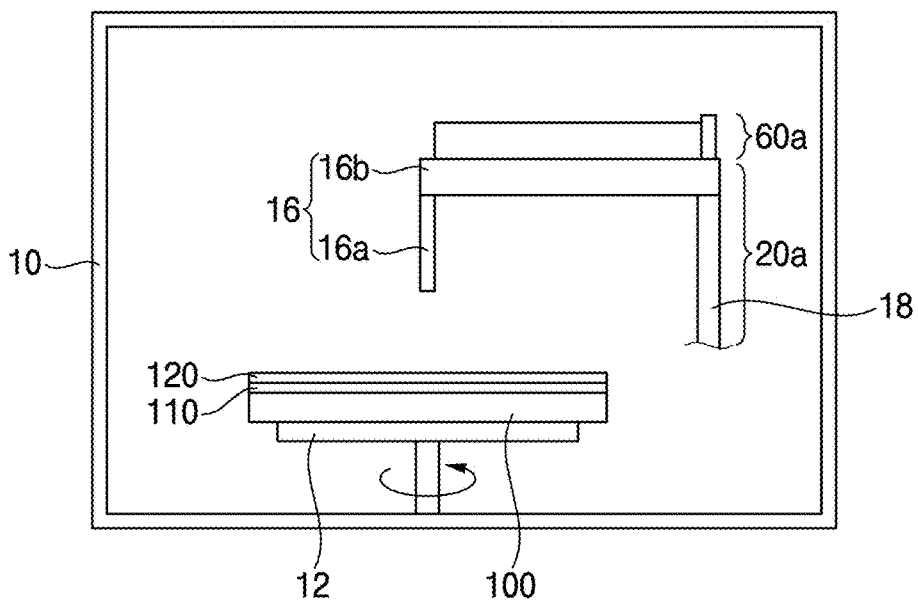
Figure 15:
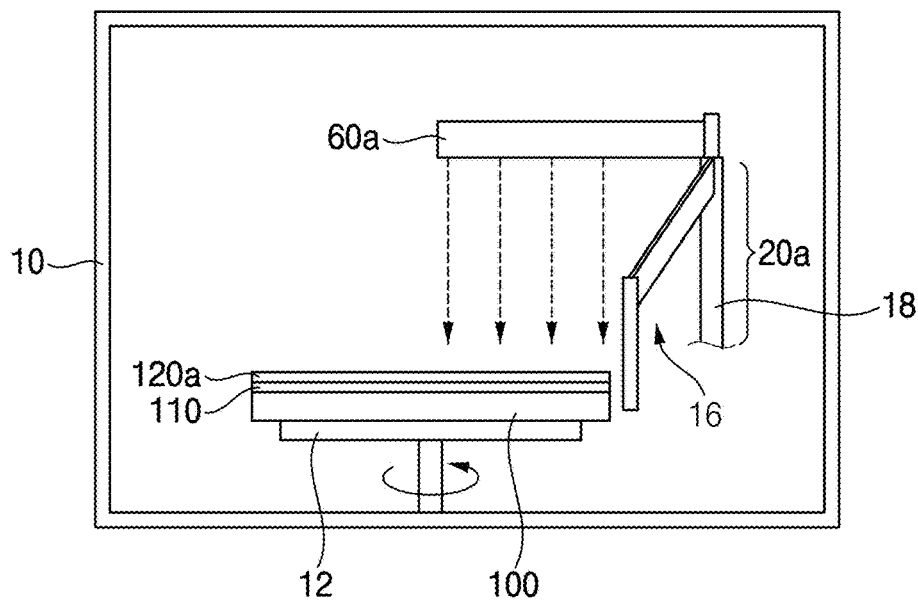

FIGS. 14 and 15 are cross-sectional views illustrating an
apparatus for the cleaning process according to an example
embodiment.

FIG. 14 is the apparatus for the cleaning process when
chemicals are supplied in the apparatus. FIG. 15 is the
apparatus for the cleaning process when a lamp is used.

Referring to FIGS. 14 and 15, the apparatus for the
cleaning process may include a chamber 10, and a substrate
stage 12, a nozzle structure 20a and a lamp 60a formed in
the chamber 10. In addition, the apparatus for the cleaning
process may further include controllers (not shown) for
controlling operations of the substrate stage 12, the nozzle
structure 20a, and the lamp 60a, respectively.

The nozzle structure 20a may be disposed over the
substrate stage 12. The nozzle structure 20a may be spaced
apart from an upper surface of the substrate stage 12. For
example, the nozzle structure 20a includes a chemical
supply unit (not shown) for supplying the photocurable
resin, a nozzle 16 for discharging the photocurable resin
from the chemical supply unit onto the upper surface of the
layer 110, and a driving unit 18 for driving and moving the
nozzle 16. The nozzle 16 may include a first extension
portion 16a extending in a direction perpendicular to the
upper surface of the substrate 100 and a second extension
portion 16b extending in a horizontal direction from one end
of the first extension portion 16a. The second extension
portion 16b may be connected to the driving unit 18.
Positions of the first and second extension portions 16a and
16b of the nozzle 16 may be moved by the driving unit 18.

The lamp 60a may be disposed above the nozzle structure
20a. The lamp 60a may extend in the horizontal direction.
A light emission surface of the lamp 60a may be disposed to
face at least a portion of the upper surface of the substrate
100.

Referring to FIG. 14, when the lamp 60a is not used, the
nozzle 16 of the nozzle structure 20a may be disposed to
face at least a portion of the upper surface of the substrate
100. The position of the first extension portion 16a of the
nozzle 16 may be moved to face a central portion of the
upper surface of the substrate 100. The lamp 60a may
overlap the second extension portion 16b of the nozzle 16.
Accordingly, at least the light emission surface of the lamp
60a may be covered by the second extension portion 16b.

When discharged chemical through the first extension
portion 16a of the nozzle 16 is spin-coated to form the
photocurable resin layer 120 on the layer 110, the light
emission surface of the lamp 60a may be covered by the second extension portion 16b of the nozzle structure 20a so
as not to be exposed to the outside. Therefore, when the lamp
60a is not used in the cleaning process, contamination of the
lamp 60a due to the chemical or the like may not occur.

Referring to FIG. 15, when the lamp 60a is used in the
cleaning process, the nozzle 16 of the nozzle structure 20a
may be moved so as not to face the central portion of the
upper surface of the substrate 100. In addition, the light
emission surface of the lamp 60a and the second extension
portion 16b of the nozzle 16 may not overlap each other.
Therefore, the light may be irradiated onto the photocurable
resin layer 120 to form a polymer layer 120a.

When the lamp 60a is used in the cleaning process, the
substrate stage 12 may be horizontally rotated or moved so
that the light may be uniformly irradiated onto the photo-
curable resin layer 120.

In some example embodiments, the light may be radiated
at least a portion corresponding to a radial portion of the
substrate 100 through the light emission surface of the lamp
60a, and the substrate stage 12 may be horizontally rotated.

A plurality of light emitting members may be disposed on
the light emission surface of the lamp 60a. The light emitting
members may be, for example, unit light emitting devices
(e.g., unit lamps).

The light emitting members may be arranged to uniformly
irradiate light on the upper surface of the photocurable resin
layer 120.

In some example embodiments, the light emitting mem-
bers on the light emission surface of the lamp 60a may be
disposed to face a radial portion of the substrate 100. The
intensity of the light irradiated from the light emitting
members may vary depending on the positions of the light
emission surface. That is, light emitting members having
different intensities of the light may be disposed depending
on the positions of the light emission surface. Accordingly,
an amount of the light irradiated onto positions of the
substrate 100 may be adjusted. For example, the intensity of
the light emitted from the light emitting members facing an
edge of the substrate 100 may be greater than the intensity
of the light emitted from the light emitting members facing
the central region of the substrate 100.

In some example embodiments, the light emitting mem-
bers on the light emission surface of the lamp 60a may be
disposed to face the radial portion of the substrate 100, and
an arrangement density of the light emitting members (e.g.,
the number of the light emitting member) may vary depend-
ing on the positions in the light emission surface. Accord-
ingly, an amount of the light irradiated onto positions of the
substrate 100 may be adjusted.

In some example embodiments, the area of the nozzle
structure 20a may be different depending on the positions of
a portion facing the substrate 100, and thus an area of the
light emission surface of the lamp 60a may vary depending
on the positions of the light emission surface. Accordingly,
an amount of the light irradiated to positions of the substrate
100 may be adjusted.

While the present inventive concepts have been shown
and described with reference to some example embodiments
thereof, it will be understood by those of ordinary skill in the
art that various changes in form and details may be made
thereto without departing from the spirit and scope of the
present inventive concepts as set forth by the following
claims.

What is claimed is:
1. An apparatus for a cleaning process, comprising:
a chamber;

a substrate stage at a lower portion of an inside of the chamber, and the substrate stage configured to horizontally rotate;

a nozzle structure over the substrate stage in the chamber;

a light source structure configured to face the substrate stage in the chamber; and a controller, wherein the light source structure includes a lamp unit configured to irradiate light, the lamp unit including an emission region including a lamp and a non-emission region including no lamp, and a protective structure configured to protect the lamp unit and be coupled to the lamp unit, the protective structure including a light blocking portion and an open portion, and wherein the controller is configured to control the protective structure to selectively block light irradiated from the lamp unit.

2. The apparatus of claim 1, wherein the protective structure surrounds at least a portion of a surface of the lamp unit.

3. The apparatus of claim 1, wherein the lamp unit is inside the protective structure.

4. The apparatus of claim 1, wherein the lamp is configured to be covered or exposed by a movement of the protective structure or the lamp unit.

5. The apparatus of claim 1, wherein when the emission region of the lamp unit and the light blocking portion of the protective structure overlap each other, the light blocking portion is configured to cover at least the emission region, and when the emission region of the lamp unit and the open portion of the protective structure overlap each other, at least a portion of the emission region is configured to be exposed through the open portion.

6. The apparatus of claim 5, wherein the emission region and the non-emission region of the lamp unit are alternately and repeatedly arranged, and the light blocking portion and the open portion of the protective structure are alternately and repeatedly arranged.

7. The apparatus of claim 6, wherein each of the lamp unit and the protective structure has a disk shape, and the protective structure or the lamp unit is configured to horizontally rotate so that the emission region of the lamp unit and the light blocking portion of the protective structure overlap each other or the emission region of the lamp unit and the open portion of the protective structure overlap each other.

8. The apparatus of claim 1, wherein the lamp unit is at an upper portion of an inside of the chamber, and the lamp unit is configured to face the substrate stage.

9. The apparatus of claim 1, wherein the nozzle structure includes a nozzle and a driver configured to drive and move the nozzle.

10. The apparatus of claim 1, wherein the light irradiated from the lamp unit includes ultraviolet (UV) light or laser.

\* \* \* \* \*